(12) United States Patent
Abe

(10) Patent No.: US 6,611,144 B2
(45) Date of Patent: Aug. 26, 2003

(54) MAGNETIC RESONANCE IMAGING DEVICE

(75) Inventor: Takayuki Abe, Matsudo (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/203,260

(22) PCT Filed: Feb. 7, 2001

(86) PCT No.: PCT/JP01/00832

§ 371 (c)(1),
(2), (4) Date: Aug. 7, 2002

(87) PCT Pub. No.: WO01/58352

PCT Pub. Date: Aug. 16, 2001

(65) Prior Publication Data

US 2003/0011368 A1 Jan. 16, 2003

(30) Foreign Application Priority Data

Feb. 7, 2000 (JP) .......................................... 2000-29817

(51) Int. Cl.[7] ................................................ G01V 3/00
(52) U.S. Cl. ....................................... 324/309; 324/307
(58) Field of Search ................................. 324/309, 307, 324/310, 311, 312, 318, 322

(56) References Cited

U.S. PATENT DOCUMENTS 5,341,099 A * 8/1994 Suzuki ........................ 324/309
5,570,019 A * 10/1996 Moonen et al. ............. 324/309
5,612,619 A * 3/1997 Feinberg ...................... 324/309
5,825,184 A * 10/1998 Gullapalli et al. .......... 324/309
5,912,557 A  6/1999 Wilman et al. ............. 324/309
6,326,786 B1 * 12/2001 Pruessmann et al. ....... 324/312

* cited by examiner

*Primary Examiner*—Edward Lefkowitz
*Assistant Examiner*—Brij B. Shrivastav
(74) *Attorney, Agent, or Firm*—Antonelli, Terry, Stout & Kraus, LLP

(57) ABSTRACT

In a contrast MRA measurement, sampling order of k-space is controlled considering the distance from the origin such that sampling the low-frequency data is performed a time when the contrast concentration reaches it peak. First, the sampling points of k-space are divided into two groups. Then, a measurement of the first group is started a time when the contrast concentration of a blood vessel of interest becomes high and is controlled from the high-frequency component to the low-frequency component such that the distance of a sampling point from the origin progressively decreases. A measurement of the other group, which is performed successively, is controlled from the low-frequency component to the high-frequency component such that the distance of a sampling point from the origin progressively increases. According to this ordering, influence of measurement time error in the contrast MRA measurement can be reduced and the whole blood vessel can be imaged with high contrast. In addition, an artery can be selectively imaged.

11 Claims, 11 Drawing Sheets

(d)

(c)

(b)

(a)

distance

Sampling points on a slice-phase coordinate of a three-dimensional measurement space Sampling points on a slice-phase coordinate of a three-dimensional measurement space (a) Offset SP Centric Order   (b) Elliptical Centric Order

MAGNETIC RESONANCE IMAGING DEVICE

FIELD OF THE INVENTION

The present invention relates to a magnetic resonance imaging apparatus (MRI apparatus) for obtaining tomograms of desired portions of an object to be examined using nuclear magnetic resonance (NMR). In particular, it relate to an MRI apparatus capable of obtaining desired range of images of excellent quality in minimal time to enable visualization of movement in the vascular system.

BACKGROUND OF THE INVENTION

An MRI apparatus utilizes NMR to measure density distribution and relaxation time etc. of atomic nuclear spins (referred as spins hereinafter) in a desired portion of an object to be examined and displays images of desired slices of the object produced from the measured data. Conventional MRI apparatuses have a blood flow imaging function called MR angiography (MRA). This function includes a method using a contrast agent and a method using no contrast agent.

In a common method using a contrast agent, a gradient echo type sequence of short TR (repetition time) is used in combination with a T1-shortening type contrast agent such as Gd-DTPA. The method utilizes the fact that blood spins containing T1 shortening contrast agent are not likely to be saturated by the repeated excitation of a short TR because the blood spins have a shorter T1 than those of surrounding tissues and generate high-strength signals relative to the surrounding tissues, and enables to visualize blood vessels filled with blood containing a contrast agent with high contrast relative to the other tissues. Measurement of volume data including blood vessels, typically three-dimensional measurement, is conducted while the contrast agent remains in the blood of interest and the obtained three-dimensional images are combined and subjected to projection process to depict blood flow. In order to obtain information of wide range and high resolution, sequence based on the three-dimensional gradient echo method for obtaining three-dimensional data is generally employed.

In order to produce good images in such a three-dimensional contrast MRA, the following factors are important. (1) A manner of injecting a contrast agent, and (2) Measurement time or timing. With regard to (1), the contrast agent should be injected such that its high concentration is maintained in a blood vessel of interest in a stable manner. For this purpose, a rapid injection method using an automatic injection machine is generally utilized.

With regard to (2), if arteries are selectively imaged, for example, the imaging timing is determined such that the concentration of the contrast agent becomes high when data are acquired. Ideally, the concentration of the contrast agent reaches its peak value when a central part (low frequency region) of the k-space which controls the image contrast is sampled. The timing is determined corresponding to date-acquisition ordering of an employed pulse sequence.

Conventional data-acquisition ordering includes a sequential ordering in which data are acquired from one high-frequency side of k-space toward the other high-frequency side via a low-frequency region, and a centric ordering in which data are acquired from low-frequency region of the k-space toward both high-frequency sides alternately. Generally, the centric ordering is employed. In a centric ordering in a three-dimensional measurement, one of a phase encoding loop and a slice encoding loop is set to be an outer loop and the other to be an inner loop, and either or both is controlled by a centric ordering.

However, as shown in FIG. 1(b), the centric ordering in this case is not a centric ordering in a true sense because a distance between the k-space origin and a sampling point fluctuates, and therefore likely to be influenced by movement of an examined object and makes separation of arteries and veins insufficient.

For solving this problem, an elliptical centric ordering is proposed, in which sampling order is controlled in view of the relative FOV (Field of View) such that the distance from the ky-kz space origin to a sampling point increases as the measurement proceeds (FIG. 1(c)) ("Performance of an Elliptical Centric View Order for Signal Enhancement and Motion Artifact Suppression in Breath-hold Three-Dimensional Gradient Echo Imaging. Alan, et al. Magnetic Resonance in Medicine 38:793–802,1997")

This data-acquisition method enables to produce arterial images selectively by starting measurement at the time when the concentration of a contrast agent in the blood vessel of interest increases since low-frequency region data that dominates the image contrast are measured at the beginning of the measurement time.

Although the above-mentioned centric ordering and elliptical centric ordering enable to determine the image contrast in the early stage of measurement and are efficient for obtaining arterial images, if the optimal measuring moment is missed, the low-frequency information is acquired during the concentration of a contrast agent is low and thereby image quality becomes degraded. Especially, if the measuring time is too early, the low-frequency data is sampled in the time period when signals of a blood vessel are extremely low and the high-frequency region data is sampled in the time period when the signals of the blood vessel are high. This causes rinsing artifacts having no direct current component. In addition, the measurement time is prolonged because overall measurement is performed from the origin as a center toward the high-frequency region of the k-space horizontally or vertically.

On the other hand, the sequential ordering enables to produce stable images in which remarkable artifact is not likely to generate even if the measurement timing is somewhat wrong. However, this ordering is susceptible to movement of an examined object similarly to the aforementioned centric ordering and separation of artery and veins becomes insufficient.

Accordingly, an object of the present invention is to provide an MRI apparatus capable of visualizing a whole of a blood vessel of interest with high contrast in minimal time while reducing the influence of time shift (error) from an optimal measurement time. Another object of the present invention is to provide an MRI apparatus which is insusceptible to the influence of movement of an examined object and capable of visualizing arteries and veins separately. Yet another object of the present invention is to provide a data-acquisition method suitable for MRA.

DISCLOSURE OF THE INVENTION

In order to achieve the above-mentioned objects, an MRI apparatus of the present invention employs a data-acquisition method in which sampling points of k-space are divided into two groups and, in the first group which is measured first, sampling order is controlled from the high-frequency region toward the low-frequency region such that the distance from the k-space origin to a sampling point progressively decreases and, in the second group, sampling order is controlled in an opposite manner from the low-frequency region toward the high-frequency region such that the distance from the k-space origin to a sampling point progressively increases.

Specifically, an MRI apparatus of the present invention comprises static magnetic field generating means for generating a static magnetic field in a space where an object to be examined is placed, gradient magnetic field generating means for applying gradient magnetic fields in the slice direction, phase encoding direction and readout direction, transmitting means for applying high-frequency magnetic field to cause nuclear magnetic resonance in atomic nuclei of a living tissue of the object, receiving means for detecting echo signals emitted by the nuclear magnetic resonance, control means for controlling the magnetic field generating means, transmitting means and receiving means, signal processing means for performing image reconstruction operation using the echo signals detected by the receiving means, display means for displaying the produced image, wherein the control means performs a three-dimensional sequence including a slice encoding step and a phase encoding step, upon performing the sequence, divides sampling points of a k-space defined by a slice encode number and phase encode number into two groups and controls the gradient magnetic field generation means of slice direction and phase direction such that the distance from the origin of the k-space to a sampling point progressively decreases in the measurement of the first group and the distance from the origin of the k-space to a sampling point progressively increases in the measurement of the second group.

The manner of dividing the sampling points of the k-space into two group may be such that at least one of the groups includes sampling points from a low-frequency region to a high-frequency region and the other includes at least sampling points of a low-frequency region. A number of sampling points which are really measured may be the same or different in the two groups. Namely, either of the two groups may include non-sampling points (the points which are not measured).

Specifically, one embodiment is that sampling points are divided into two groups depending on the region of the k-space. According to this embodiment, the control system performs a three-dimensional sequence including a slice encoding step and a phase encoding step, upon performing the sequence, divides the k-space defined by the slice encode number and the phase encode number into two regions, and controls gradient magnetic field generating means of the slice direction and the phase direction such that, in one of the regions, the distance from the origin of the k-space to a sampling point progressively decreases and, in the other region, the distance from the origin of the k-space to a sampling point progressively increases.

In another embodiment, the sampling points of the k-space are divided into two groups which are in a relation of complex conjugate. According to this embodiment, the control system performs a three-dimensional sequence including a slice encoding step and a phase encoding step, upon performing the sequence, divides sampling points of the k-space defined by a slice encode number and phase encode number into two groups which share the origin and are in a relation of complex conjugate, and controls gradient magnetic field generating means of the slice direction and phase direction so that, in one of the groups, the distance from the origin of the k-space to a sampling point progressively decreases and, in the other group, the distance from the origin of the k-space to a sampling point progressively increases.

In this embodiment, it is preferable that adjacent two sampling points belong to different groups. In order to satisfy the condition that sampling points of the two groups are complex conjugate each other, some of the adjacent sampling points near the origin are required to belong the same group. Accordingly, in the specification, the wording "to divide such that the adjacent sampling points belong to the different groups" means the state satisfying as much as possible the condition that the two groups are in a relation of complex conjugate and the adjacent sampling points belong to the different groups.

In yet another embodiment of the MRI apparatus of the present invention, the control system does not measure all of the sampling points in one of the two divided regions but measures a smaller number of sampling points than that of the other region. Or the control system does not measure all of the sampling points in one of the two groups but measures a smaller number of sampling points than that of the other group.

A three-dimensional image data-acquisition method of the present invention comprises, when a three-dimensional image data is acquired by repeating a plurality of times a step comprising selective excitation of a predetermined region of an object to be examined, application of encoding gradient magnetic fields at least in two directions, and collection of echo signals generated from the region while changing the intensities of the gradient magnetic fields, divides a measurement space defined by the gradient magnetic fields encoding in the two directions, and performs measurement of the tow divided regions sequentially such that the distance from the origin of the measurement space to a sampling point gradually decreases in the measurement of a region which is measured first and the distance from the origin of the measurement space to a sampling point gradually increases in the measurement of the region which is measured thereafter.

In the data-acquisition method of the present invention, when there are several sampling points whose distances from the origin are the same, the nearest sampling point from the latest measured point in the k-space is preferably measured next.

A three-dimensional image data-acquisition method of the present invention, when three-dimensional image data is acquired by repeating a plurality of times a step comprising selective excitation of a predetermined region of an object to be examined, application of encoding gradient magnetic fields at least in two directions, and collection of echo signals emitted from the region while changing the intensity of the gradient magnetic fields, divides sampling points on a measurement space defined by the intensities of the encoding gradient magnetic fields of the two directions into two groups such that the first group and the second group share the origin and that adjacent and conjugating sampling points belong to different groups, and performs measurement of the first group and the second group in this order such that, in a measurement of the first group, the distance of a sampling point from the origin of the measurement space progressively decreases and, in a measurement of the second group, the distance of a sampling point from the origin of the measurement space progressively increases.

According to the data-acquisition method of the present invention, as shown in FIG. 1($a$), measurement can be performed without fluctuation of distance from the origin and a blood vessel concerned can be visualized with high contrast by making the time of measuring the lowest frequency component coincide with the time when the contrast agent enhance the signal intensity of the blood vessel most. In addition, even the time of measuring the low-frequency component is somewhat shifted from the peak of the signal intensity, proper sampling of the low-frequency component can be assured and images are not degraded.

For reference, variations of distance from the origin of the k-space in the conventional centric ordering, elliptical centric ordering and sequential ordering are shown in FIG. 1(b)–(d).

According to a preferable embodiment of the data-acquisition method of the present invention, a part of all of the sampling points is measured in the first group and all of the sampling points are measured in the second group.

Since the two groups are in a relation of complex conjugate, even if a part of one group is not measured, data which are not measured can be estimated from data of the other group. Particularly when a measurement of the first group is performed during the density of the contrast agent is increasing to its peak, sampling of unnecessary data having low signal intensity is avoided and thereby images of good quality can be obtained.

THE BEST MODE FOR CARRYING OUT THE PRESENT INVENTION

An embodiment of the present invention will be explained with reference to the attached drawings hereinafter.

Figure 1:
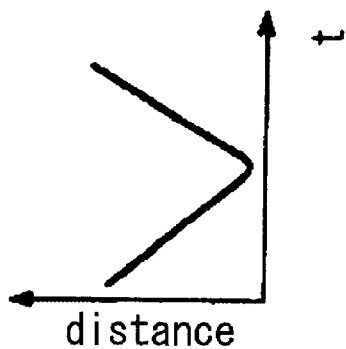
FIG. 1 shows exemplary views of a data-acquisition method employed by the MRI apparatus of the present invention and conventional data-acquisition methods.
Figure 1:
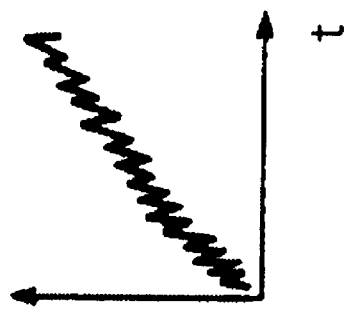
Figure 1:
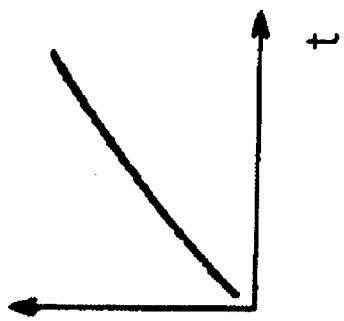
Figure 1:
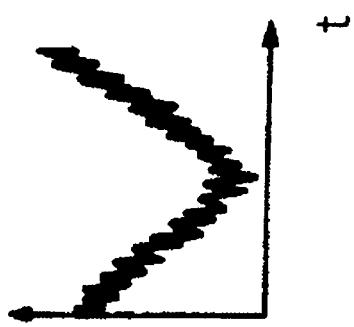
Figure 2:
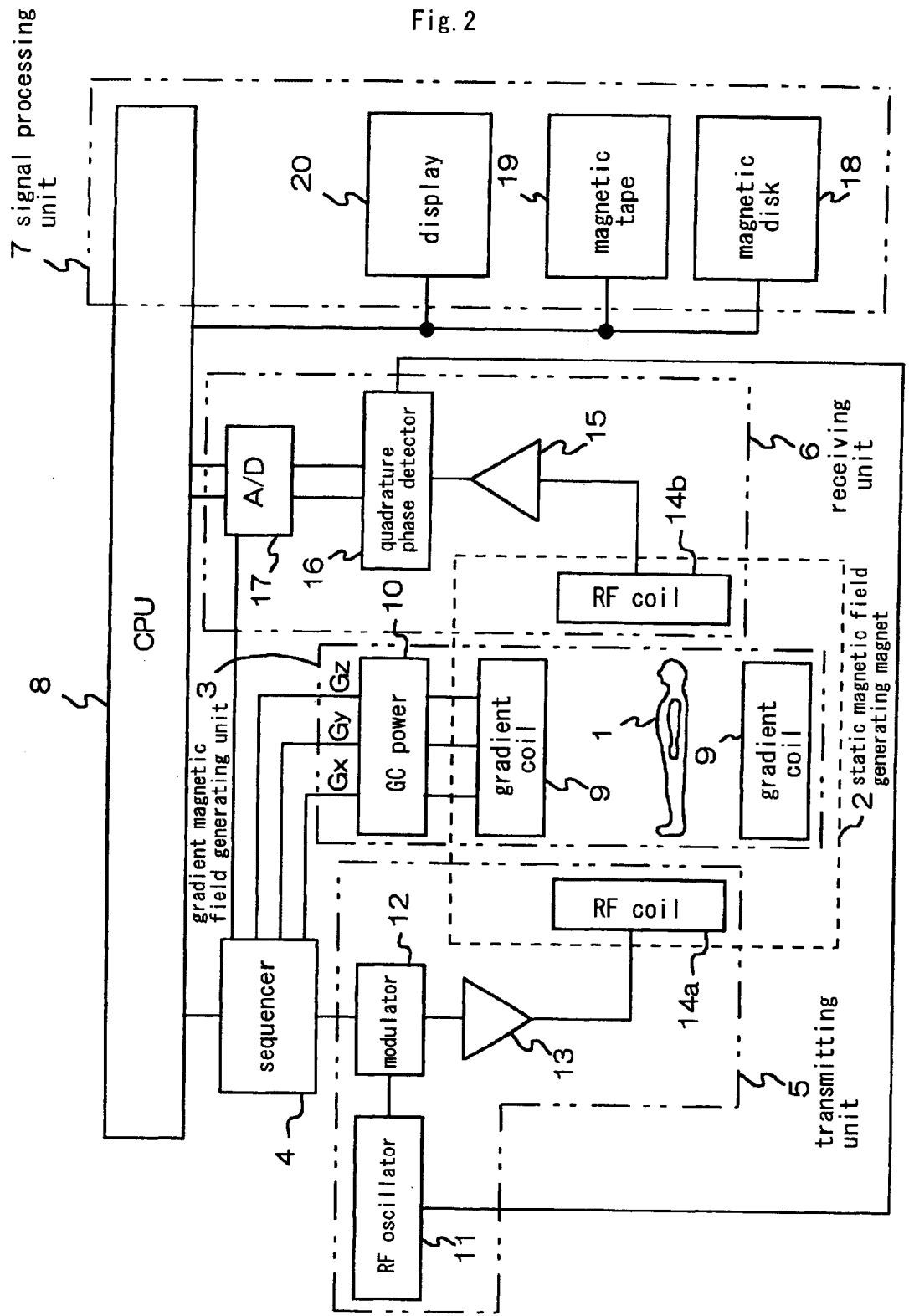
FIG. 2 is an overall block diagram of the MRI apparatus of the present invention.

FIG. 2 is an overall block diagram of the MRI apparatus of the present invention. The MRI apparatus is for obtaining tomograms utilizing NMR and comprises a static magnetic field generating magnet 2, a gradient magnetic field generating unit 3, a sequencer 4, a transmitting unit 5, a receiving unit 6, a signal processing unit 7, and a central processing unit (CPU) 8.

The static magnet field generating magnet 2 generates a uniform static magnetic field around an object to be examined in a direction parallel or perpendicular to the body axis of the object and comprises means for generating a static magnetic field in a space around the object such as a permanent magnet, a resistive magnet or a superconductive magnet.

The gradient magnet field generating unit 3 comprises gradient magnetic field coils 9 wound in the direction of three axes, X, Y, Z, and a gradient magnetic field power supply 10 for driving the gradient magnetic field coils. The gradient magnetic field power supply 10 is driven according to instructions from the sequencer 4 and applies gradient magnetic fields Gx, Gy and Gz in the direction of the three axes, X, Y and Z, to the object. A manner of applying these gradient magnetic fields determines a slice or slab of the object to be selectively excited and defines position or sampling order of sampling points in a measurement space (k-space).

The sequencer 4 operates under the control of the CPU 8, and sends necessary instruction for collecting data for obtaining tomograms of the object to the gradient magnet field generating unit 3, the transmitting unit 5 and the receiving unit 6. The operation timing of the gradient magnet field generating unit 3, the transmitting unit 5 and the receiving unit 6 controlled by the sequencer 4 is called a pulse sequence. Here, a sequence for imaging three-dimensional blood flow is employed as one of sequences. The control of the sequencer 4 will be explained in more detail later.

The transmitting unit 5 is for producing an FR magnetic field in order to cause nuclear magnetic resonance of nuclei of atoms constituting the living tissues of the object in accordance with the RF pulse transmitted from the sequencer 4, and comprises an FR oscillator 11, a modulator 12, an RF amplifier 13 and an RF coil for transmission 14a. The transmitting unit 5 amplitude-modulates the RF pulses output from the RF oscillator 11 by the modulator 12 in accordance with instructions from the sequencer 4. The amplitude-modulated RF pulses are amplified by the RF amplifier 13 and supplied to the RF coil 14a located in the vicinity of the object 1 so that electromagnetic waves are radiated onto the object 1.

The receiving unit 6 is for detecting echo signals (NMR signals) elicited through nuclear magnetic resonance of atomic nuclei of the living tissues of the object 1, and comprises an RF coil 14b for receiving electromagnetic waves, an amplifier 15, a quadrature phase detector 16 and an A/D converter 17. The electromagnetic waves of the object responding to the electromagnetic waves radiated by the RF coil 14a of the transmitting unit is detected by the RF coil 14b located in the vicinity of the object 1. The detected echo signals are input into the A/D converter 17 via the amplifier 15 and the quadrature phase detector 16, converted into digital signals, which are sampled by the quadrature phase detector 16 with a timing instructed by the sequencer 4 to become two-series data, and transferred to the signal processing unit 7.

The signal processing unit 7 comprises the CPU 8, recording media such as a magnetic disk 18 and magnetic tape 19, and a display unit 20 such as a CRT. The CPU 8 performs operations onto echo signals (digital signals) input from the receiving unit 6 such as Fourier transform, calculation of a correction coefficient and image reconstruction, and thereby produces and displays a signal intensity distribution of a certain section or images produced by performing suitable arithmetic operations on a plurality of signals as a tomogram on the display unit 20. In FIG. 2, the RF coils 14a, 14b for transmission and receiving and the gradient magnetic field coils 9 are disposed within a magnetic field space of the static magnet field generating magnet 2 placed in a space around the object 1.

A first embodiment of a blood flow imaging performed by the MRI apparatus according to the present invention will now be explained.

As mentioned previously, the sequencer 4 controls operation timings of the gradient magnet field generating unit 3, transmitting unit 5 and receiving unit 6 according to the predetermined pulse sequence, here a three-dimensional MRA sequence. The pulse sequence, similarly to other sequences, is stored as a program in a memory provided in CPU8 and selected properly by a user corresponding to the purpose of imaging to be performed. Specifically, if MRA measurement using a contrast agent is selected through an input module of CPU 8, the CPU 8 controls the sequencer 4 to perform the three-dimensional MRA sequence.

Figure 3:
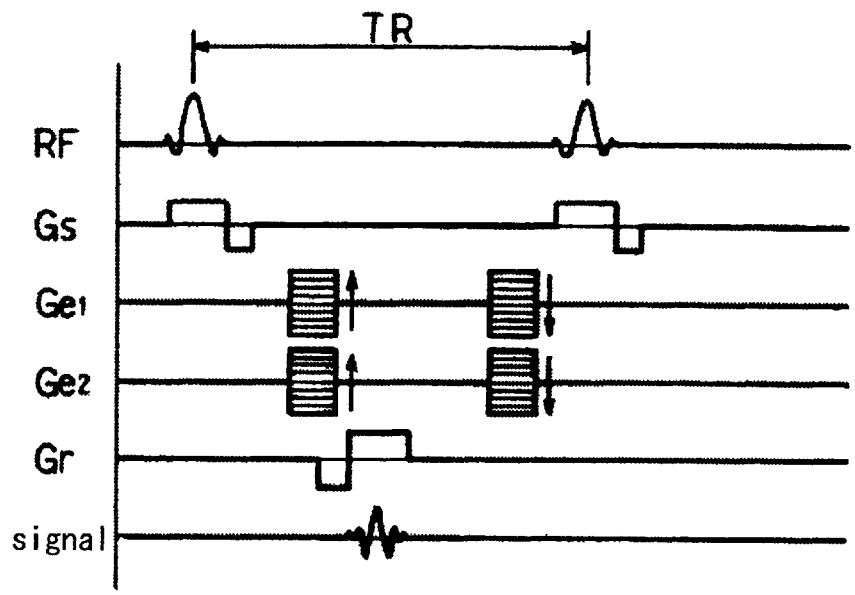
FIG. 3 shows an example of a pulse sequence of contrast MRA measurement performed by the MRI apparatus of the present invention.

This pulse sequence is, as shown in FIG. 3 for example, a sequence based on the gradient echo method and is common in the conventional three-dimensional MRA sequence. Specifically, after a region (slab) including a blood vessel of interest is excited by applying a selecting gradient magnetic field Gs together with an RF pulse RF, a gradient magnetic field pulse Ge1 in the slice direction and a gradient magnetic field pulse Ge2 in the phase encode direction are applied and then a readout gradient magnetic field Gr is applied while reversing its polarity to measure echo signals. Procedures from applying the RF pulse RF to measurement of echo signals are repeated while changing the intensities of the gradient magnetic field Ge1 in the slice direction and the gradient magnetic field Ge2 of the phase encode direction with a predetermined repetition time TR to acquire three-dimensional data.

The encode number of the slice direction and that of the phase encode direction define an image resolution in the both directions and are predetermined in consideration of a measurement time or the like. For example, the encode number of the phase encode direction is set to be 128, 256, etc. and that of the slice direction is 10–30. The encode numbers of the slice direction and phase encode direction also define k-space (provided that the slice direction is z and phase encode direction is y, ky-kz space). In the sequence shown in FIG. 3, a signal measured when the intensity of the slice direction gradient magnetic field Ge1 has a value of Gz and the intensity of the phase-encode direction gradient magnetic field Ge2 has a value of Gy is disposed at a point (ky,kz) of the k-space corresponding to Gy and Gz.

Although the three-dimensional MRA sequence exemplified in FIG. 3 is common in the conventional MRA, data-acquisition method of this sequence employed in this embodiment is different from the conventional centric ordering or elliptical ordering. In this method, the ky-kz space is divided into two along with a ky-axis or kz-axis and, in one region which is measured first, a sampling order is controlled from the high-frequency component toward the low-frequency component such that a point whose distance from the origin is large is sampled first and a point to be sampled becomes closer to the origin 0. Contrarily, in the other region, a sampling order is controlled from the low-frequency component toward the high-frequency component such that the origin 0 or the vicinity thereof is sampled first and a point to be sampled becomes more distant from the origin 0.

In this case, if there are several points whose distances from the origin are same, the nearest point from the last sampled point in the k-space is sampled next.

Namely, this data-acquisition method is defined by "AND" of two conditions: 1) In one of the two divided regions, a measurement is started with the most distant point from the origin and then points to be sampled are successively determined such that the distance from the origin decreases and, in the other region, a measurement is started with the origin or the vicinity of the origin and then points to be sampled are successively determined such that the distance from the origin increases. 2) Distance between the temporarily adjacent sampling points becomes minimum.

Although the condition 2) is not indispensable in the data-acquisition method of the present invention, when the spatial distance between the temporarily adjacent sampling points is made as close as possible, artifact is suppressed. For this purpose, instead of satisfying the above condition of a distance between two sampling points, a sampling point having the same ky value or the nearest ky value may be selected as a next sampling point. Further, a sampling point may be determined in consideration of not only relationship of the two sampling points but also relationship among a plurality of sampling points which are sampled next or afterward.

Figure 4:
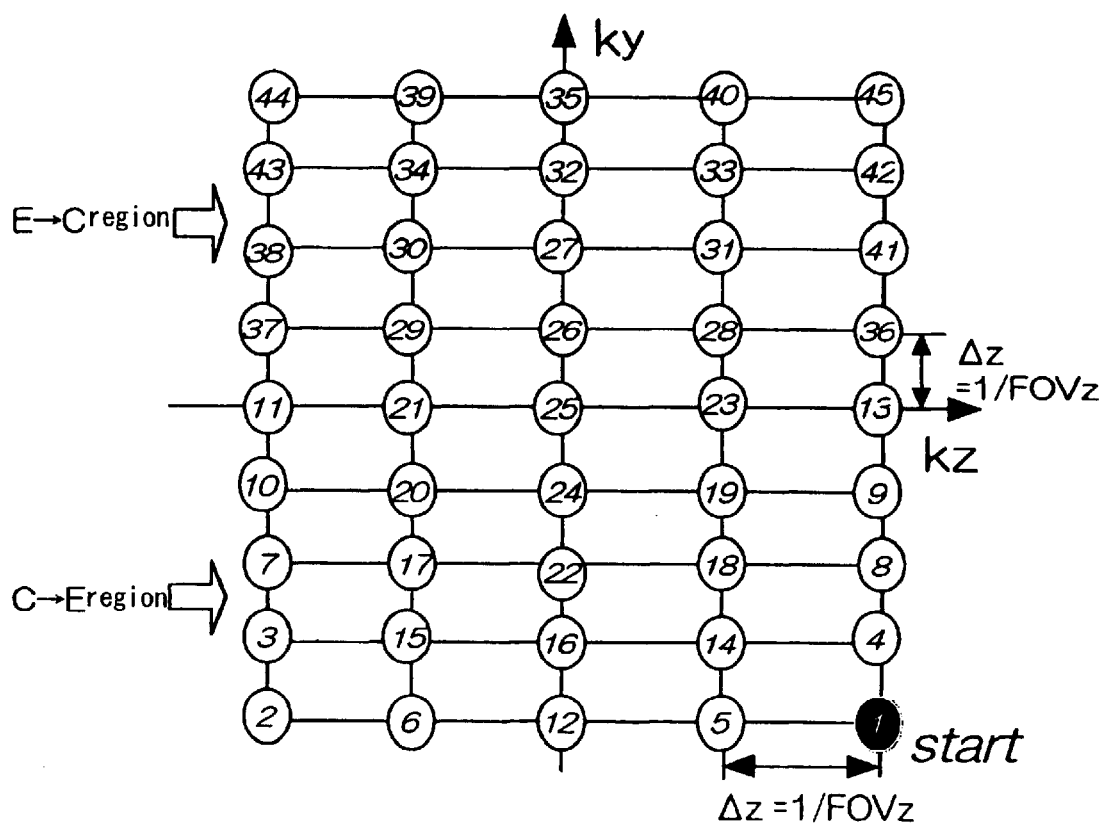
FIG. 4 shows an example of a k-space data-acquisition method according to the present invention.

As a simplified example of the afore-mentioned data-acquisition method, FIG. 4 shows a data-acquisition ordering of the k-space having 5*9 matrix where the slice encode number is 5 and the phase encode number is 9. In the figure, circled numbers indicate data-collection order. In this example, the k-space is divided into two by kz axis and, in the lower region (E→C region), data are sampled from a point (number 1) marked "start" in a high-frequency region toward the origin (number 25) in numerical order and, in the upper region (C→E region), data are sampled from the origin toward the high-frequency region and ended at a number 45. The distance Δz between the adjacent points in the k-space coordinate is 1/FOVz.

Next, an embodiment of a contrast MRA measurement performed by the aforementioned MRI apparatus employing such a data-acquisition method will be explained with reference to FIG. 5.

First, an object to be examined is placed in a measurement space within the static magnet field magnet and an imaging region including a blood vessel of interest is determined. Then, a timing measurement is performed by a test injection method. In this method, a small amount of a contrast agent (about 1–2 ml) is injected as a test dose in order to obtain a time-signal curve of the object portion as shown in FIG. 5. Arriving time t1 of the contrast agent is found from this curve and a timing of the measurement is determined based on the result. Instead of the test injection method, a method where an ROI (Region of Interest) is set in a specific portion within a monitored region, variation of signal intensity of that portion is monitored and a measurement is started automatically at a time when the signal intensity exceeds a predetermined threshold value, or a method where a blood vessel of interest is monitored in real time by repeating a short time measurement and display called fluoroscopy, and a measurement is started at a time when the signal intensity is properly enhanced can be employed for the timing measurement. However, the test injection method is preferred because it enables to determine measurement timing accurately by using a contrast agent prior to a main measurement.

After the timing measurement, a main measurement is performed as shown in FIG. 5(b). The main measurement may be performed only after injection of the contrast agent but preferably performed before and after injection of the contrast agent. The measurements are carried out successively before and after injection for the same slice or slab position under the same condition.

The imaging sequence is a short TR sequence based on the three-dimensional gradient echo method as shown in FIG. 3. In this case, since an imaging object is blood flow, a gradient magnetic field for rephasing a dephase caused by flow, i.e., gradient moment nulling may be added to the sequence. However, this is not essential and a simple gradient echo is rather preferable in order to shorten the TR/TE.

Once the repetition time TR of the pulse sequence and a matrix size (slice encode number and phase encode number) are determined, the measurement time T is determined. Then starting time t2 (a time from injection of a contrast agent to the beginning of measurement) is determined based on the arriving time t1 of the target blood vessel obtained in the aforementioned timing measurement such that data in a low-frequency region of the ky-kz space are sampled at a time when the contrast agent arrives at the blood vessel.

First, a measurement of the E→C region shown in FIG. 4 is performed and then a measurement of the C→E region is carried out. In this case, the sequencer 4 controls both a slice direction gradient magnetic field pulse and a phase encode direction gradient magnetic field pulse so as to sample from a high-frequency component toward a low-frequency component sequentially in a region measured first (for example E→C region), and sample from a low-frequency component toward a high-frequency component sequentially in the region measured thereafter (for example C→E region). In this control, as mentioned previously, a distance from the origin to a sampling point gradually decreases in the first region and increases in the second region.

According to this control, the low-frequency component of the k-space is sampled at a time when the contrast agent arrives at the target blood vessel and the signal intensity of the blood becomes highest and thus images of the artery can be visualized with high contrast. Since there remains a time for sampling a low-frequency component on both sides of the arriving time t1 of the contrast agent as shown in FIG. 5(b), even if the arriving time in the main measurement slightly differs from that (t1) determined in the timing measurement due to a slight change of conditions between the two measurement, high quality images can be obtained without degrading the quality. Results of simulation of separation of artery-vein using different data-acquisition methods are shown in FIG. 6. The stimulation was conducted under condition of FOV: 320, TF: 10 ms, phase encode number: 160, slice encode number: 16, image matrix: 256*256, and slice thickness: 5 mm. Separation of artery-vein is expressed using a ratio of signal intensity of an artery and a vein.

As understood from the figure, a signal ratio of the artery and vein is larger in the data-acquisition method of the present invention than in the sequential ordering and elliptical centric ordering. Accordingly, even if there is an indistinguishable vein near an artery of interest, only the artery can be depicted with high contrast.

After three-dimensional image data are thus acquired before and after injection of the contrast agent, the image data are subtracted to produce a three-dimensional data of only blood vessels. The subtraction may be a complex subtraction performed between slices on the same slice position of the three-dimensional data. Subtraction of absolute values may be employed. Such a method of deleting tissues other than blood vessels using subtraction between images obtained before and after injection of contrast agent is a known method called 3D MR-DSA(Digital Subtraction Angiography) and is not essential for the present invention. However, use of this method is preferable for imaging fine blood vessels, which are otherwise difficult to be visualized with sufficiently high contrast to other tissues.

After the subtraction, the three-dimensional data may be projected in an arbitrarily direction such as coronal direction, saggital direction, transversal direction or the like to be observed in three dimensions. A known method of projection such as Maximum Intensity Projection may be employed.

Figure 5:
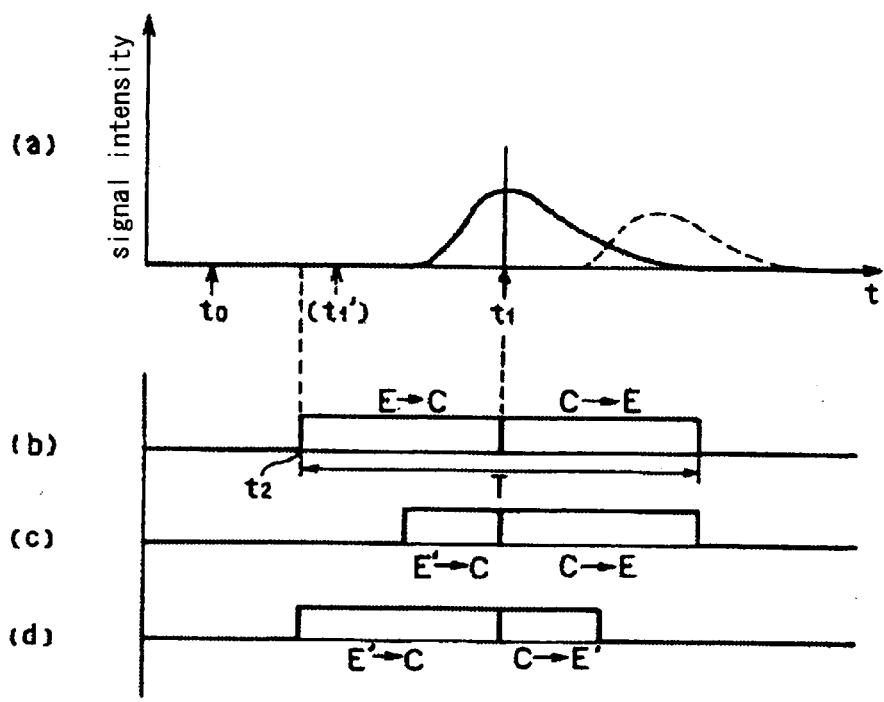
FIG. 5 is an exemplary view of MRA measurement according to the MRI apparatus of the present invention.
Figure 6:
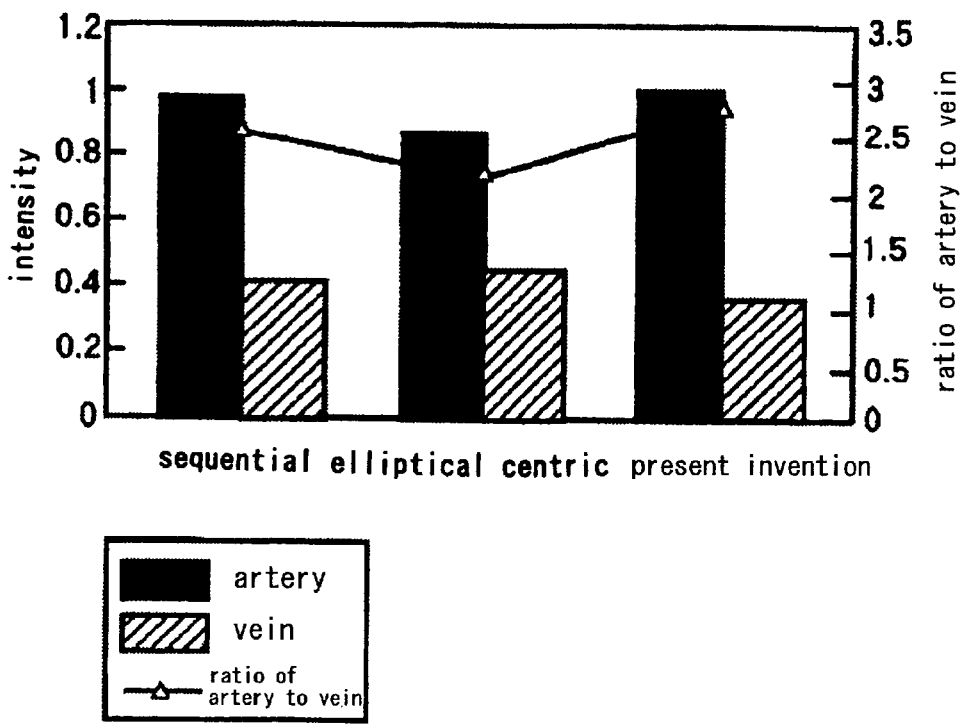
FIG. 6 shows simulation results of MRA measurement according to the MRI apparatus of the present invention and the conventional MRA measurement.

The first embodiment of the present invention has been explained using the examples shown in FIGS. 4 and 5. Various modifications thereof can be employed. For example, although a sequence according to the gradient echo method is exemplified as a three-dimensional MRA sequence in the aforementioned examples, an EPI (Echo Planer Imaging) in which a plurality number of echo signals are measured at a single excitation or a multi-shot type EPI can be employed.

The k-space is divided by the kz axis in the aforementioned example but may be divided by the ky axis. Further, although the case that data are acquired symmetrically in the divided regions has been explained, the regions to be sampled may be asymmetrical.

An example of the asymmetrical acquisition case will be explained with reference to FIG. 7. In this case too, k-space having a matrix size of 5*9 and divided by the kz axis is exemplified. In the asymmetric data acquisition, a measurement is started not from the high-frequency region but from the middle frequency region (number 1) in the first region, e.g., E-C region, toward low-frequency region (number 15) in numerical order. After that, the overall C→E region is sampled from low-frequency region to high-frequency region similarly to the case shown in FIG. 4. Alternatively, an overall region measured first is sampled and the latter half region is sampled from low-frequency region to middle-frequency region. Referring to the example shown in FIG. 7, a measurement is started with a number 35 and performed to a number 1 in decreasing numerical order.

By making the number of sampling points in one of the two regions less than in the other region, a total measurement time can be shortened. Specifically, as shown in FIG. 5(c) and (d), by reducing the number of sampling points in a region to be measured first or later, the measurement time becomes shorter than the case shown in FIG. 5(b). Further, a measurement method shown in FIG. 5(d) is effective in a case that the distance between a blood vessel of interest and a neighboring vein is short, and interval between an arrival time of the contrast agent at the blood vessel of interest and an arrival time at the neighboring vein is short. In this case, when the posterior region is sampled from the low-frequency component toward the middle-frequency component, signals from the neighboring vein is kept from getting mixed (a dot line signal intensity curve).

Figure 7:
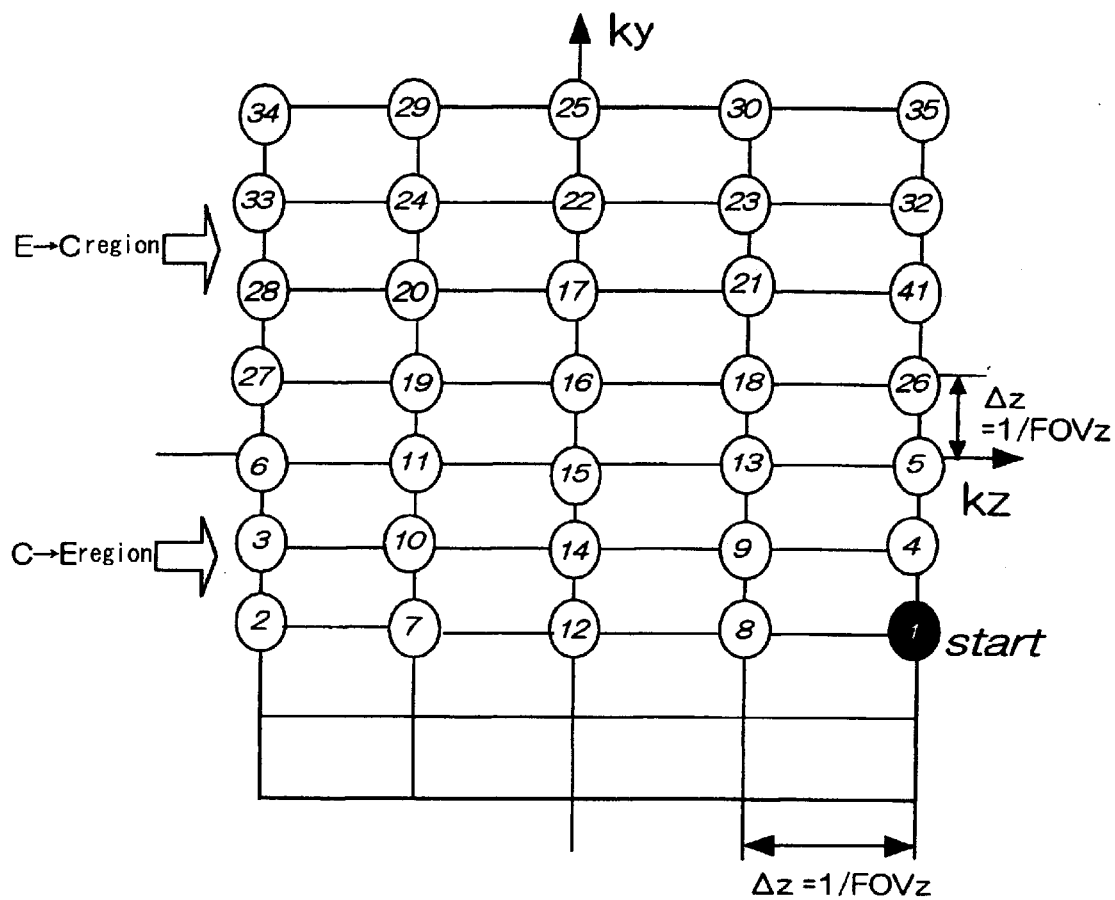
FIG. 7 shows another example of a k-space data-acquisition ordering according to the present invention.
Figure 8:
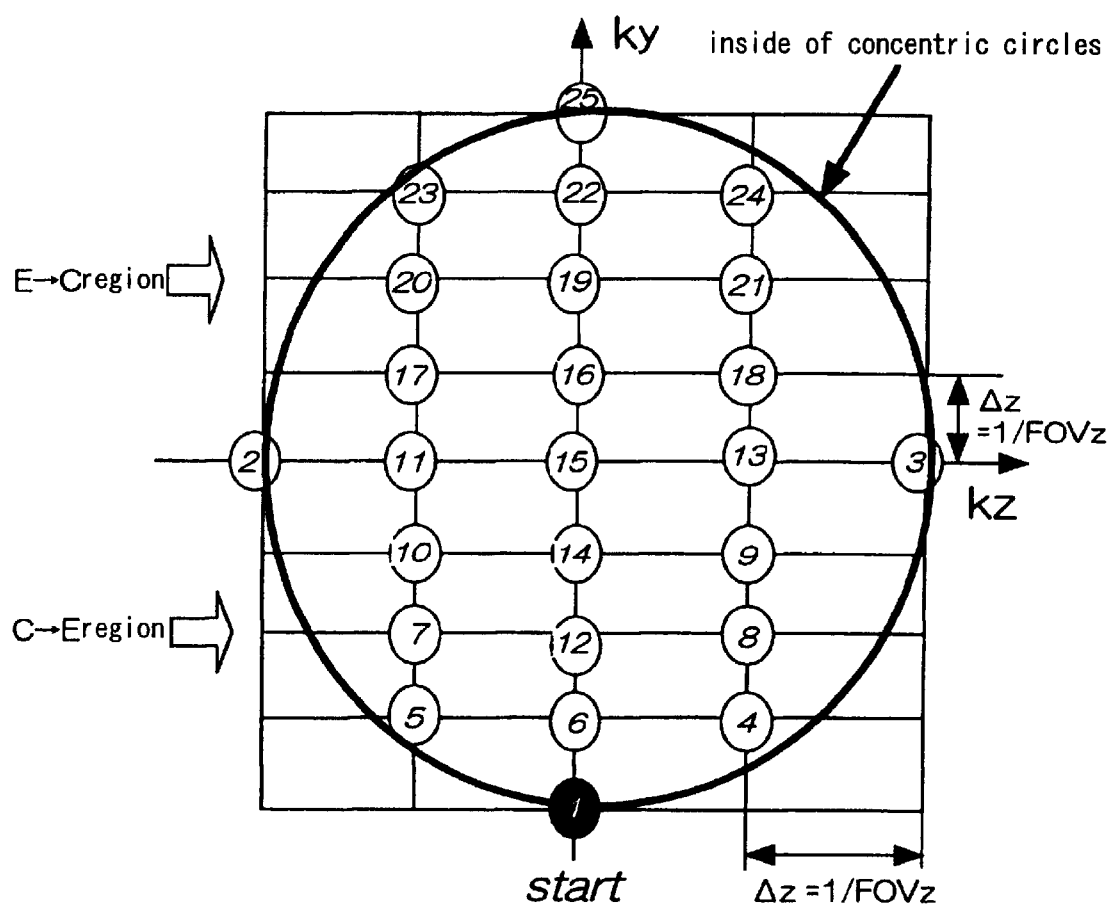
FIG. 8 shows yet another example of a k-space data-acquisition ordering according to the present invention.

In this case, data which have not been sampled of the region having a smaller number of sampling points (data of the region shown by oblique lines) may be estimated from data of the other region which have been sampled, or may be filled with 0. In addition to the aforementioned advantage, this exemplified method enables to obtain a selective arterial image with high contrast while reducing influence of time shit of three-dimensional measurement.

k-Space data acquisition is not limited to the square matrix as shown in FIGS. 4 and 7 but only data within a circle (ellipse) centering around the origin (number 15) may be acquired as shown in FIG. 8. In FIG. 8, the slice encode number of 5 and the phase encode number of 9 are also exemplified but, in this example, a region where both ky and kz become high-frequency component (outer side of the circle) is not sampled and data on concentric circles centering around the origin (number 15) are sampled. Data acquisition order is, as shown by circled numbers, in such a manner that the lower half is sampled from a distant point from the origin toward the origin and the upper half is sampled from the origin toward distant point.

In this case, the same effect as that of the method illustrated in FIG. 4 can be obtained. In this case too, data may be compensated using measured data.

The first embodiment of the present invention, in which the k-space is divided into two regions and sampling points are divided into two groups corresponding to the region, has bee explained hitherto. The sampling points may be divided into two groups regardless of the region.

The second embodiment of the present invention, in which the sampling points of the k-space are divided into two groups in such a manner that sampling points having a relationship of complex conjugate belong different groups.

In this embodiment, when matrix points of sampling points of the k-space, e.g. ky-kz space, are to be divided into two, the following conditions should be satisfied: 1) the two groups share the origin and the sampling points of the two groups are in a relation of complex conjugates, 2) adjacent sampling points in the k-space belong to different groups. Then these two groups are sampled successively.

Figure 9:
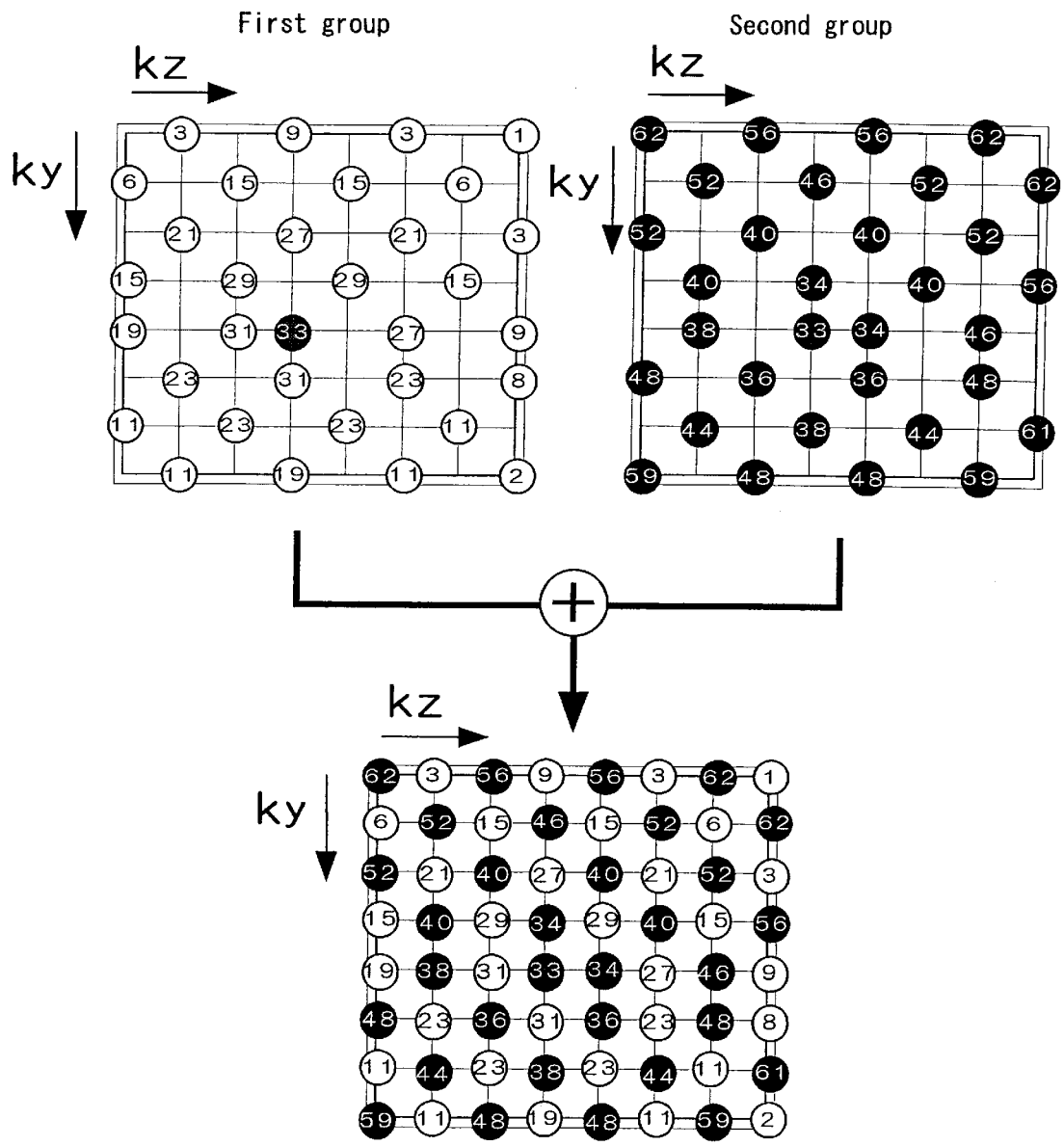
FIG. 9 shows an example of a k-space data-acquisition ordering according to the present invention.

As a simplified example of data-acquisition method according to the second embodiment, FIG. 9 shows k-space having a matrix of 8*8 with a slice encode number of 8 and a phase encode number of 8. This matrix has sixty four of matrix points (sampling points), which are divided into the first group shown in the right side of the figure and the second group shown in the left side. The matrix points belonging to the two groups are in a relation of complex conjugate and the adjacent points belong to the different group. However, adjacent points near the origin have to belong to one group in order to satisfy the relationship of complex conjugate.

Sampling of the first group of two, which is sampled first, is started with a distant point from the origin 0 and is controlled from the high-frequency component to the low-frequency component such that the distance from the origin 0 to a sampling point becomes closer progressively. Sampling of the second group is controlled in an opposite manner from the low-frequency component to the high-frequency component such that the origin 0 or the neighborhood is sampled first and the distance from the origin 0 to a sampling point becomes more distant progressively.

The circled numbers in the figure show the data acquisition order. Sampling points having the same number have no priority and either may be sampled first.

In the first group to be sampled first, measurement is started with the most distant matrix point (number 1) from the origin (number 33 is assigned), i.e., the highest-frequency component and proceeded to the matrix point of number 2 next, the matrix point of number 3 and so on in numerical order. Measurement of the second group is succeeded, in which the nearest point (number 34) from the origin, the low-frequency component, is sampled first and the distance from the origin to a sample point increases progressively.

An example of a contrast MRA by the above MRI apparatus employing such a data-acquisition method now will be explained with reference to FIG. 10.

In the same manner as that of the first embodiment, an object to be examined is placed in a measurement space within the static magnet field magnet and a measurement region including a blood vessel of interest is determined. Then a timing measurement is carried out. In this case too, the timing measurement is performed using the test injection method for example. Specifically, a small amount of a contrast agent (about 1–2 ml) is injected into the object and a time-signal curve in the target portion is obtained as shown in FIG. 10. Arrival time t1 of the contrast (a time of signal intensity peak) is found from the curve and timing of a main measurement is determined based on the result.

Figure 10:
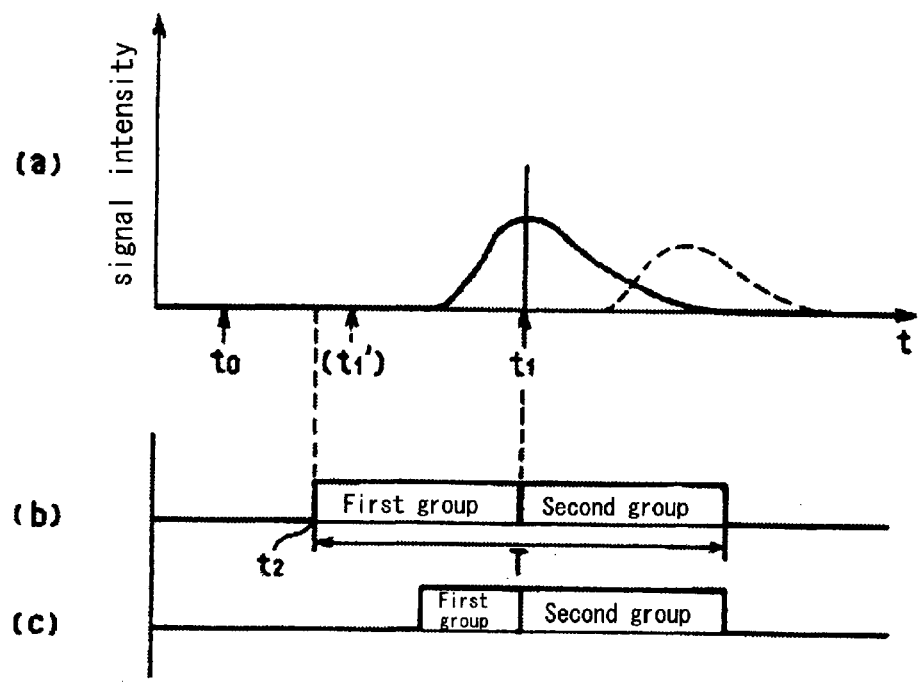
FIG. 10 shows an exemplary view of MRA measurement according to the MRI apparatus of the present invention.

After the timing measurement, the main measurement is performed as shown in FIG. 10(*b*). The main measurement may be carried out only after injection of the contrast agent but preferably carried out before and after injection. The measurements are carried out successively before and after injection for the same slice or slab position under the same condition.

The imaging sequence is a short TR sequence based on the three-dimensional gradient echo method as shown in FIG. 3. In this case, since an imaging object is blood flow, a gradient magnetic field for rephasing a dephase caused by flow, i.e., gradient moment nulling may be added to the sequence. However, this is not essential and a simple gradient echo is rather preferable in order to shorten the TR/TE.

Once the repetition time TR of the pulse sequence, a matrix size (slice encode number and phase encode number) and a number of addition are determined, the measurement time T is determined. Then starting time t2 (a time from injection of a contrast agent to the beginning of measurement) is determined based on the arriving time t1 at a blood vessel of interest found in the aforementioned timing measurement such that a measurement of data in a low-frequency region of the ky-kz space are sampled at a time when the contrast agent arrives at the blood vessel.

First, a measurement of the first group is started and then a measurement of the second group is performed. In this case, the sequencer 4 controls both a slice direction gradient magnetic field pulse and a phase encode direction gradient magnetic field pulse so as to sample from a high-frequency component toward a low-frequency component sequentially in a region measured first, and to sample from a low-frequency component to a high-frequency component progressively in the region measured thereafter. Thus three-dimensional image data are obtained.

In the data-acquisition method illustrated in FIGS. 9 and 10, all of the sampling points are sampled for both of the first and second groups. However, as shown in FIG. 10(*c*), another data-acquisition method may be employed in which sampling of a predetermined high-frequency component is omitted and a low-frequency component is sampled for a short time.

Figure 11:
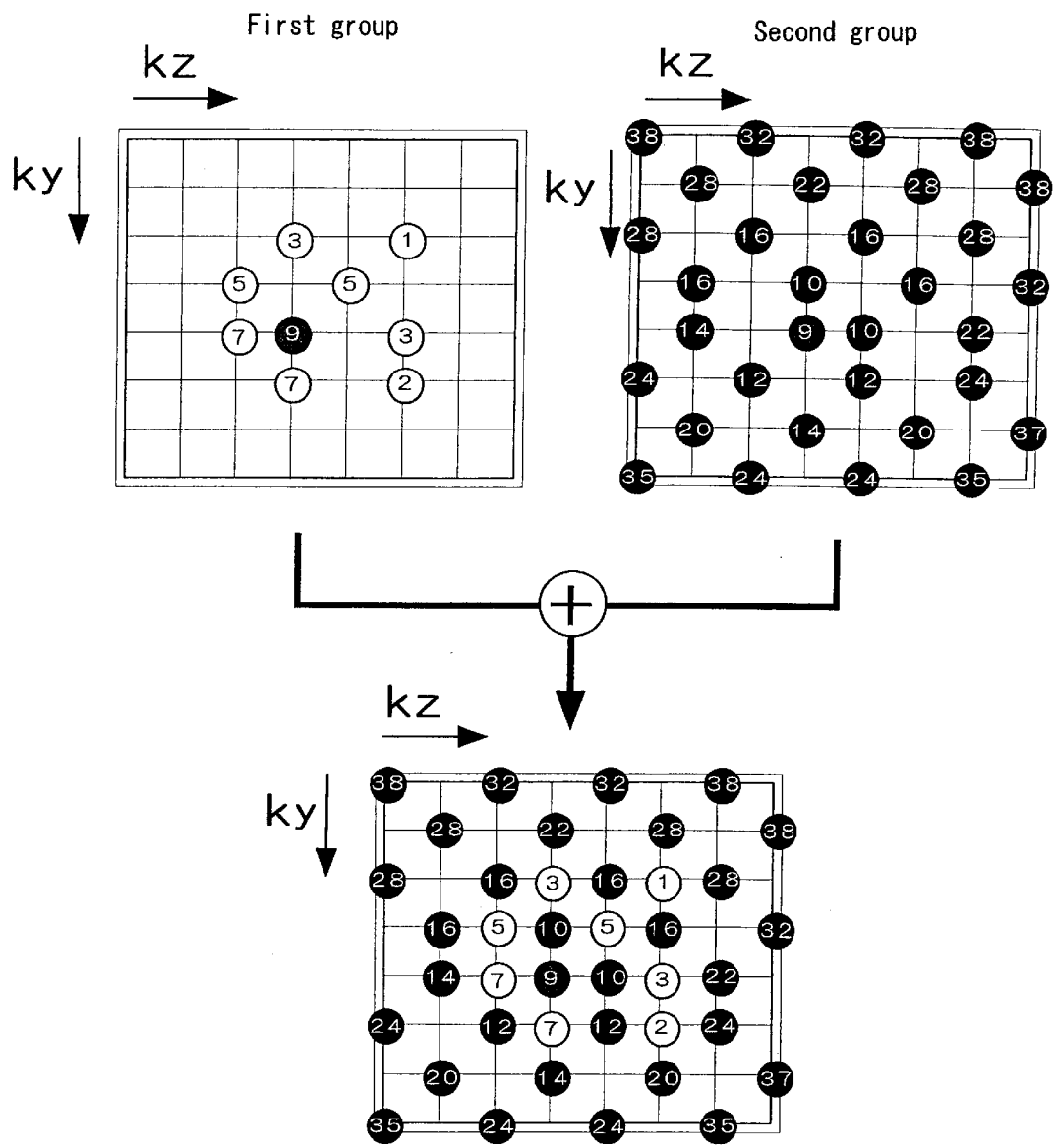
FIG. 11 shows yet another example of a k-space data-acquisition ordering according to the present invention.

An example of such a data-acquisition method is shown in FIG. 11. In the figure, the k-space having matrix size of 8*8, a slice encode number of 8 and phase encode number of 8, is illustrated. Although conditions of dividing k-space into two groups in this example is the same as those of the example shown in FIG. 9, a predetermined high-frequency component is not sampled and only low-frequency component is sampled in the first group which is measured first. In the illustrated method, only matrix points on the 4*4 matrix among the matrix points of the k-space are sampled. Among these matrix points in the low-frequency region, a most distant matrix points from the origin (point of number 9) is sampled first, and sampling is proceeded to a point of number 2 next, a point of number 3 third and to the origin.

In the second group, similarly to the example shown in FIG. 9, sampling is started with a matrix point (number 10) adjacent to the origin and proceeded toward the most high-frequency component in an order according to the distance from the origin, and thus overall points belonging to the second group is sampled.

Figure 12:
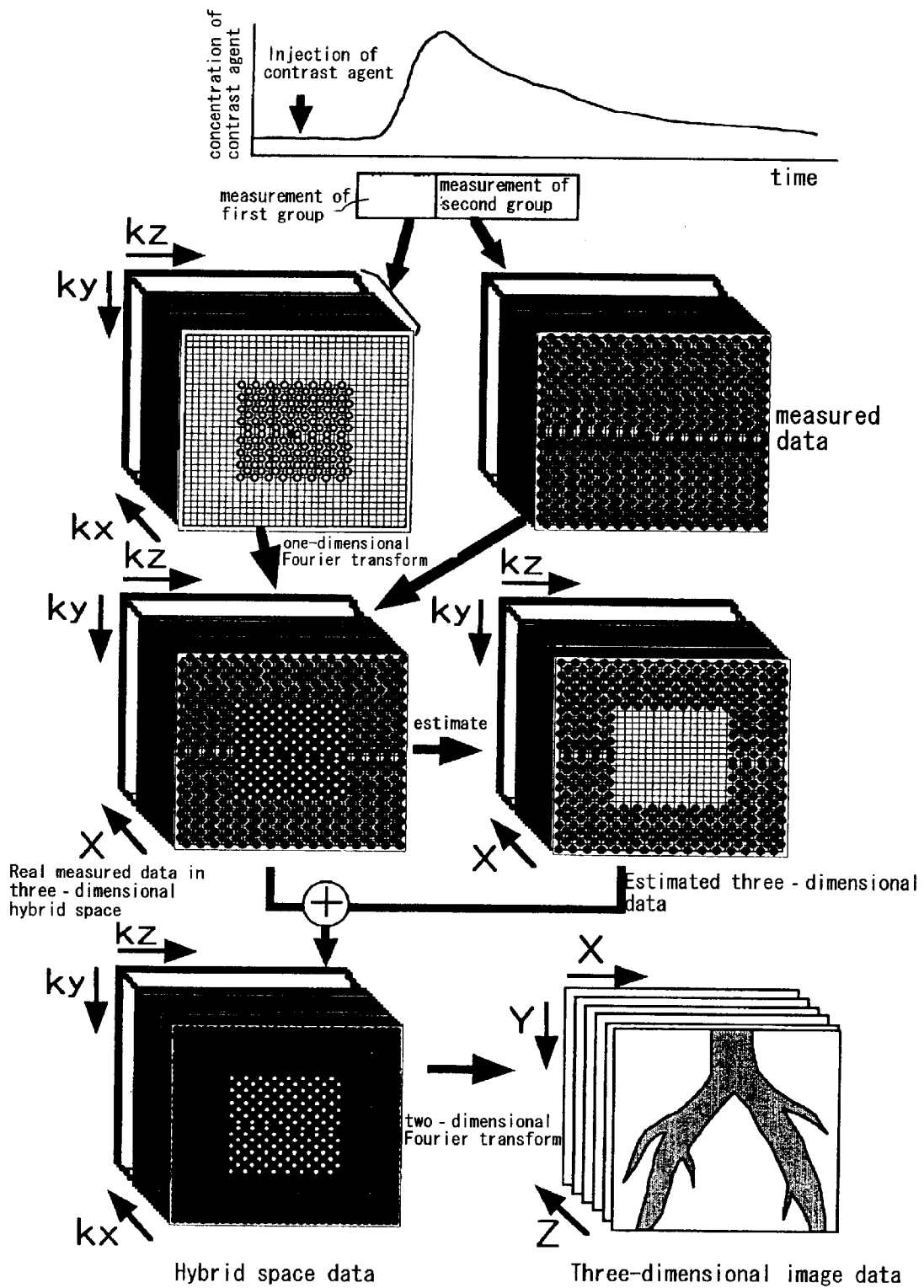
FIG. 12 shows an exemplary view of an image reconstruction method using the data-acquisition method of FIG. 10.

In this case, high-frequency data which have not sampled in the first group are estimated from data based on the complex conjugate relationship between the first group and the second group. A manner of estimating the data which have not been sampled may be a known method based on a half-Fourier transformation. The procedure of the estimation is shown in FIG. 12. Sampled data are subjected to one-dimensional Fourier transform in a frequency encode direction (kx direction) to produce a three-dimensional hybrid space sampled data, from which three-dimensional data is estimated. Then the estimated hybrid space data and combined with the sampled data to obtain a complete hybrid space data. Fourier transform of this complete hybrid space data produces three-dimensional image data. Employing the estimation of data prevents degradation of special resolution even if the number of data points is reduced.

In this embodiment, similarly to the data-acquisition method shown in FIG. 9, the low-frequency component of k-space is sampled when the contrast agent arrives at the blood vessel of interest and the signal intensity of the blood vessel is enhanced most. Accordingly, images of an artery can be imaged with high contrast.

In addition, since the concentration of a contrast agent (signal intensity) rapidly increases after injection of the contrast agent as shown in FIG. 12, if this imaging method is performed so that a sampling time of the most low-frequency component is synchronized with a signal intensity peak, sampling of unnecessary data before arrival of the contrast agent is omitted because of its short measurement time before the peak.

Figure 13:
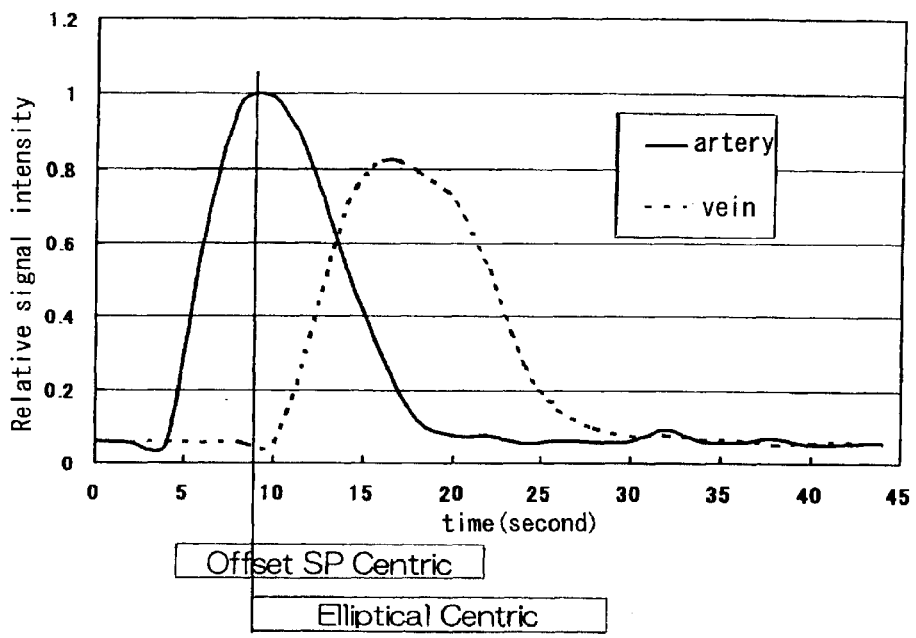
FIG. 13 shows a simulation result for evaluating the MRA measurement by the MRI apparatus of the present invention.
Figure 14:
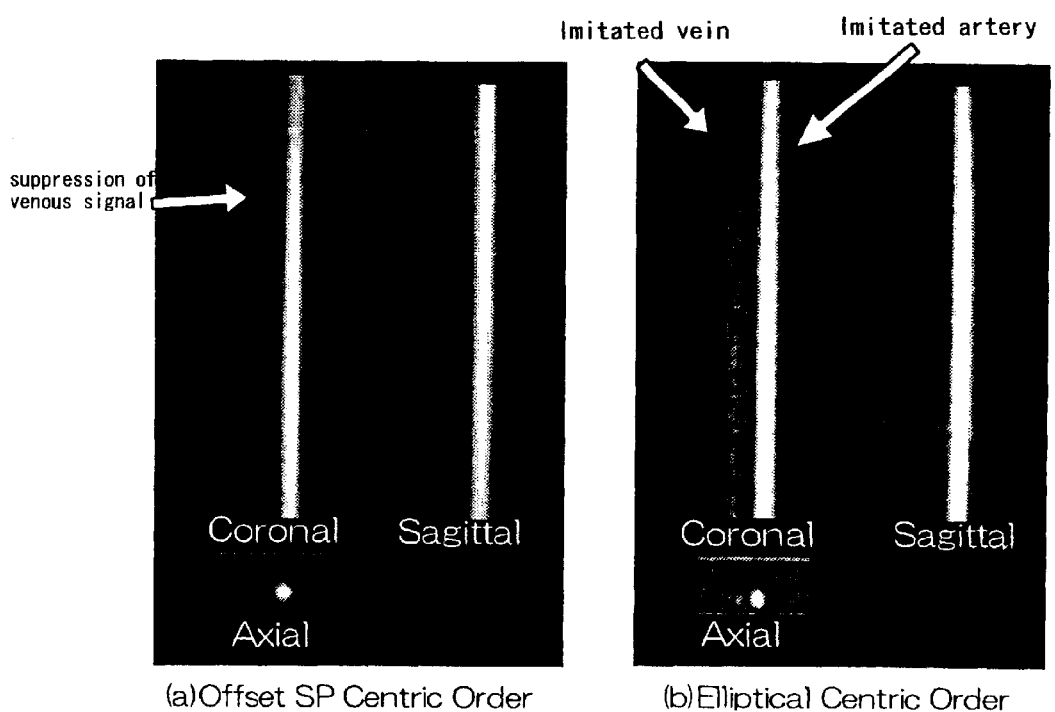
FIG. 14 shows simulation results of MRA measurement according to the MRI apparatus of the present invention and the conventional MRA measurement.

Results of simulation of artery-vein separation using different data-acquisition methods are shown in FIGS. 13 and 14. The simulation was conducted using an imitated artery and vein, through which a contrast agent is passed at a flow speed of 40 cm/s, a circulating time between the artery and vein of 7 seconds, and an injecting speed of 2 cc/sm, and images of the artery and the vein were produced using different imaging methods. FIG. 13 shows signal intensities obtained under the above conditions. As shown in the figure, a peak intensity of signals from the artery is observed first and then a peak intensity of signals from the vein appears behind. FIG. 4(a) shows an image produced by the imaging method of the present invention and (b) shows an image produced by the elliptical centric ordering.

As understood from the figure, not only the artery but also the vein are imaged and these two blood vessels are not completely separated by the elliptical centric ordering. On the other hand, only the artery can be imaged with high contrast in the imaging method of the present invention.

Although a gradient echo sequence has been also exemplified as a three-dimensional MRA sequence in the second embodiment, an EPI (Echo Planer Imaging) sequence which enables to sample a plurality of echo signals with one excitation or a multi-shot EPI may be also employed.

Figure 15:
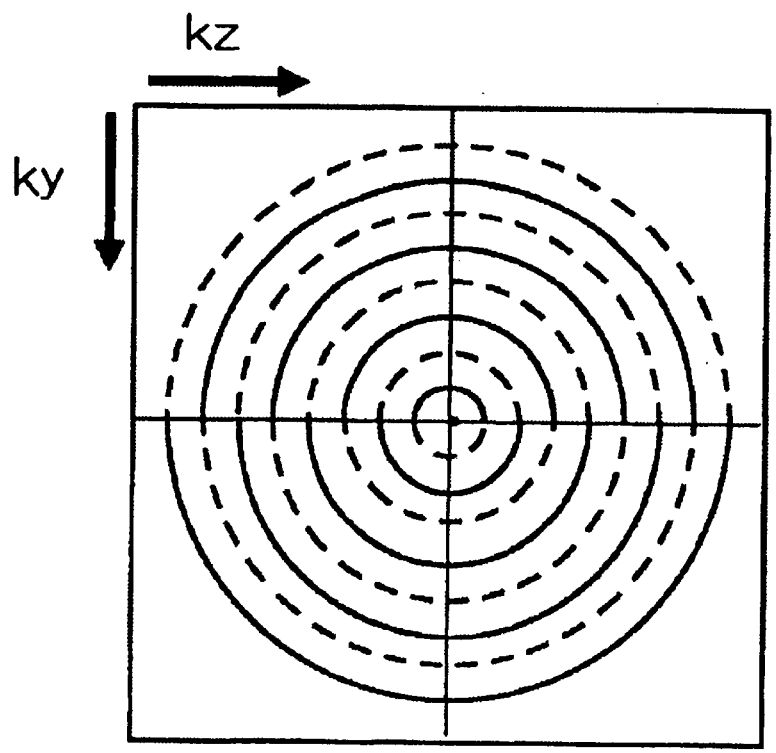
FIG. 15 shows another example of a k-space data-acquisition ordering according to the present invention.

Further, the k-space data to be acquired are not limited to a square matrix data as shown in FIGS. 9 and 11 may be data within a circle (ellipse) centering around the origin as shown in FIG. 15. In the figure, the first group, which is indicated by a real line, is sampled from the high-frequency component toward the low-frequency component such that a distant point from the k-space origin is sampled first and the distance to the origin decreases. Contrarily, the second group is sampled from the low-frequency component toward the high-frequency component such that sampling is started with the k-space origin or neighborhood and the distance from the origin to a sampling point increases. The same effect as that of the method illustrated in FIGS. 9 and 11 can be obtained and sampling of the high-frequency component of the first group can be omitted.

INDUSTRIAL APPLICABILITY

As explained hitherto, the MRI apparatus of the present invention employs a sampling control method in which ky-kz space matrix points (sampling points) are divided into two groups and the first group to be sampled first is sampled from the high-frequency component toward the low-frequency component such that the distance of a sampling point to the k-space origin progressively decreases and the second group is sampled from the low-frequency component toward the high-frequency component such that the distance of a sampling point to the k-space origin progressively increases, thereby reduces influence of imaging timing error and provides high contrast images in which a good artery-vein separation is achieved. In addition, by reducing a number of sampling points of one of the groups, a measurement time can be shortened.

What is claimed is:

1. A magnetic resonance imaging apparatus comprising static magnet field generating means for generating a static magnet field in a space where an object to be examined is placed, gradient magnetic field generating means generating gradient magnetic fields in the space in a slice direction, phase encode direction and readout direction, transmitting means for applying RF magnetic field to cause nuclear magnetic resonance in atomic nuclei of a living tissue of the object, receiving means for detecting echo signals emitted by the nuclear magnetic resonance, control means for controlling the gradient magnetic field generating means, transmitting means and receiving means, signal processing means for performing image reconstruction using the echo signals detected by the receiving means, and display means for displaying the produced images, wherein the control means performs a three-dimensional sequence including a slice encoding step and a phase encoding step and, upon performing the sequence, divides sampling points of k-space defined by a slice encode number and phase encode number into two groups and controls the gradient magnetic field generating means of the slice direction and the phase encode direction such that a distance from the k-space origin to a sampling point progressively decreases in the measurement of the first group and a distance from the k-space origin to a sampling point progressively increases in the measurement of the second group.

2. The magnetic resonance imaging apparatus of claim 1, wherein the two groups respectively belong to either of two regions divided from the k-space.

3. The magnetic resonance imaging apparatus of claim 1, wherein the two groups share the k-space origin and are in a relation of complex conjugate.

4. The magnetic resonance imaging apparatus of claim 3, wherein the sampling points of the k-space are divided such that adjacent sampling points belong to different groups.

5. The magnetic resonance imaging apparatus of claim 1, wherein at least one of the groups includes points which are not sampled.

6. The magnetic resonance imaging apparatus of claim 1, wherein an addition set of the two groups is within a circle inscribed in the k-space.

7. A data acquisition method of acquiring three-dimensional image data by repeating a plurality of times a step comprising selective excitation of a predetermined region of an object to be examined, application of encoding gradient magnetic fields at least in two directions and collection of echo signals emitted from the region while changing the intensities of the gradient magnetic fields, wherein sampling points in a measurement space defined by the intensities of the two direction encoding gradient magnetic fields are divided into the first and second groups, the first and second groups are measured successively, in the measurement, the first group to be measured first is sampled such that the distance from the measurement space origin to a sampling point decreases in a sampling order and the second group to be measured after is sampled such that the distance from the measurement space origin to a sampling point increases in a sampling order.

8. A data acquisition method of acquiring three-dimensional image data by repeating a plurality of times a step comprising selective excitation of a predetermined region of an object to be examined, application of encoding gradient magnetic fields at least in two directions and collection of echo signals emitted from the region while changing the intensities of the gradient magnetic fields, wherein sampling points in a measurement space defined by the intensities of the two direction encoding gradient magnetic fields are divided into two, the divided regions are measured successively, in the measurement, the first region to be measured first is sampled such that the distance from the measurement space origin to a sampling point decreases in a sampling order and the second region to be measured after is sampled such that the distance from the measurement space origin to a sampling point increases in a sampling order.

9. A data acquisition method of acquiring three-dimensional image data by repeating a plurality of times a step comprising selective excitation of a predetermined region of an object to be examined, application of encoding gradient magnetic fields at least in two directions and collection of echo signals emitted from the region while changing the intensities of the gradient magnetic fields, wherein sampling points in a measurement space defined by the intensities of the two direction encoding gradient magnetic fields are divided into the first and second groups such that the groups share the origin and are in a relation of complex conjugate, and adjacent matrix points belong to different groups, the first and second groups are measured successively, in the measurement, the first group to be measured first is sampled such that the distance from the measurement space origin to a sampling point decreases in a sampling order and the second group to be measured after is sampled such that the distance from the measurement space origin to a sampling point increases in a sampling order.

10. A data acquisition method of claim 7, wherein a part of the sampling points is sampled in one of the two groups and all of the sampling points are sampled in the other group.

11. A three-dimensional angiography using a contrast agent comprising the steps of measuring a time from injection of the contrast agent till arrival of the contrast agent at a blood vessel of interest, and performing a data acquisition according to a method of any one of claims 7–9, wherein a time of the beginning of the measurement of the first group is controlled such that the end of the measurement of the first group is coincident with an arrival time of the contrast agent.

* * * * *

UNITED STATES PATENT AND TRADEMARK OFFICE
CERTIFICATE OF CORRECTION

PATENT NO. : 6,611,144 B2
DATED : August 26, 2003
INVENTOR(S) : Abe et al.

It is certified that error appears in the above-identified patent and that said Letters Patent is hereby corrected as shown below:

<u>Title page,</u>
Item [75], should read:

-- [75]  Inventor(s):  Takayuki Abe, Matsudo (JP)
	Shigeru Watanabe, Kitasouma (JP) --

Signed and Sealed this

Twenty-seventh Day of January, 2004

JON W. DUDAS
*Acting Director of the United States Patent and Trademark Office*